United States Patent [19]

Gardiner et al.

[11] 4,249,968
[45] Feb. 10, 1981

[54] METHOD OF MANUFACTURING A METAL-INSULATOR-SEMICONDUCTOR UTILIZING A MULTIPLE STAGE DEPOSITION OF POLYCRYSTALLINE LAYERS

[75] Inventors: James R. Gardiner, Wappingers Falls; William A. Pliskin; Martin Revitz, both of Poughkeepsie; Joseph F. Shepard, Hopewell Junction, all of N.Y.

[73] Assignee: International Business Machines Corporation, Armonk, N.Y.

[21] Appl. No.: 974,577

[22] Filed: Dec. 29, 1978

[51] Int. Cl.$^3$ .................. H01L 21/20; H01L 21/225
[52] U.S. Cl. ..................................... 148/174; 29/571; 148/188; 357/23; 357/58; 357/59; 427/86; 427/85; 427/255.4; 427/255.7
[58] Field of Search .................. 148/174, 1.5, 188; 29/571; 427/86, 93, 85, 255.4, 255.7; 357/23, 59, 58

[56] References Cited

U.S. PATENT DOCUMENTS

| | | | |
|---|---|---|---|
| 3,519,901 | 7/1970 | Bean et al. | 148/174 X |
| 3,738,880 | 6/1973 | Laker | 148/188 X |
| 3,783,050 | 1/1974 | Nanba et al. | 148/188 |
| 3,980,507 | 9/1976 | Carley | 148/188 X |
| 4,074,300 | 2/1978 | Sakai et al. | 357/59 X |
| 4,087,571 | 5/1978 | Kamins et al. | 427/86 |
| 4,143,178 | 3/1979 | Harada et al. | 427/255.4 X |
| 4,180,826 | 12/1979 | Shappir | 357/23 X |

OTHER PUBLICATIONS

Chou et al., "Variable Threshold Field-effect Transistor" I.B.M. Tech. Discl. Bull., vol. 13, No. 6, Nov. 1970, p. 1485.

Primary Examiner—L. Dewayne Rutledge
Assistant Examiner—W. G. Saba
Attorney, Agent, or Firm—John A. Jordan

[57] ABSTRACT

A method of making a metal-oxide-semiconductor device is disclosed. A thin silicon dioxide insulating layer is formed on the surface of a planar silicon wafer. A first layer of intrinsic polycrystalline silicon is deposited over the dioxide layer, and a second layer of doped polycrystalline silicon is deposited over the intrinsic layer, thereby forming the gate. Subsequent hot processing steps result in diffusion of a portion of the dopant from the doped polycrystalline layer into and throughout the intrinsic layer so as to dope the latter. A metal contact layer is then deposited onto the gate and in superimposed vertical alignment with respect to the thin silicon dioxide insulating layer. The instrinsic nature of the first polycrystalline layer reduces grain growth and void formation in the polycrystalline silicon and thereby prevents the silicon dioxide from being attacked by hydrofluoric acid seeping through voids in the polycrystalline layer during subsequent processing. The yield for the manufacture of devices having thin oxide gates is substantially improved.

13 Claims, 13 Drawing Figures

METHOD OF MANUFACTURING A METAL-INSULATOR-SEMICONDUCTOR UTILIZING A MULTIPLE STAGE DEPOSITION OF POLYCRYSTALLINE LAYERS

BACKGROUND OF THE INVENTION

1. Field of the Invention

This invention relates generally to the manufacture of metal-insulator-semiconductor devices, and more particularly, to a novel method for preventing excessive grain growth and void formation in the polycrystalline silicon gate so as to obviate acid attack of the underlying thin oxide insulator.

2. DESCRIPTION OF THE PRIOR ART

In the manufacture of metal-oxide-semiconductor devices having a thin gate oxide layer and a polycrystalline silicon gate where the metal-to-gate contact occurs in vertical alignment with the thin gate oxide, the yields of good devices have heretofore been inexplicably low. We believe that we have discovered the failure mechanism responsible for these low yields to be as follows:

The doping of the polycrystalline silicon layer contributes to excessive grain growth with resultant void formation in the polycrystalline silicon gate. During subsequent processing, hydrofluoric acid seeped through the voids and attacked the thin silicon dioxide insulating layer. The insulating effect of the latter was thereby substantially reduced so as to permit shorting and breakdown of the devices at lower applied voltages.

SUMMARY OF THE INVENTION

It is therefore a primary object of the present invention to provide a novel method for making metal-oxide-semiconductor devices with relatively high yields by reducing the polycrystalline void formation and subsequent acid attack of the gate oxide heretofore prevalent in prior methods of making devices with thin gate oxide structures.

This is achieved by a novel technique of forming the polycrystalline silicon gate. That is, instead of depositing the gate in the conventional manner with a dopant, there is first deposited adjacent the oxide an initial layer of polycrystalline silicon which is intrinsic. Thereafter one or more doped layers of polycrystalline silicon are deposited over the initial intrinsic layer. During subsequent hot processing steps the dopant diffuses from the doped polycrystalline layers into and throughout the initially intrinsic layer, thereby providing the desired dopant profile for proper device operation. However, the intrinsic nature of the initial polycrystalline layer reduces grain growth and void formation in the latter. Attack of the underlying gate oxide by hydrofluoric acid is thereby substantially reduced and high device yields are achieved.

IN THE DRAWINGS

FIGS. 1 to 4 inclusive show the initial conventional steps of an illustrative process embodying the present invention: the steps shown in these figures are performed prior to the novel steps constituting the novel aspects of the invention and described below.

FIGS. 5 and 6 show the novel steps of depositing a first intrinsic layer of polycrystalline silicon, and thereafter depositing additional layers of doped polycrystalline silicon.

FIGS. 7 to 13 inclusive show the subsequent conventional steps which are performed after the novel steps shown in FIGS. 5 and 6.

DETAILED DESCRIPTION

Figure 1:
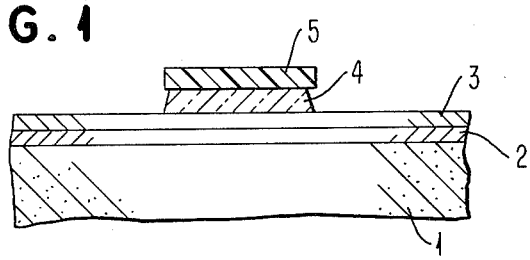

Referring first to FIG. 1, the reference numeral 1 designates generally a semiconductor wafer or substrate, preferably of P-type conductivity. Upon the upper surface of substrate 1 there is grown a silicon dioxide layer 2 of about 300 Å thickness. Deposited upon layer 2 is a silicon nitride layer 3 of about 300 Å thickness. A second silicon dioxide layer 4 of about 500 Å thickness is deposited over the layer 3. A photoresist layer 5 is deposited over silicon dioxide layer 4. Whereas layers 2, 3 and 4 extend throughout the upper surface of substrate 1, photoresist layer 5 is configured in the manner shown. The substrate is then subjected to a conventional etching process so as to etch away those portions of silicon dioxide layer 4 which are not protected by the superimposed photoresist layer 5. The resulting structure is shown in FIG. 1.

Figure 2:
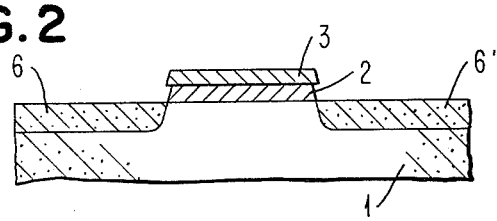

Referring now to FIG. 2, the substrate is then subjected to a boron ion implantation to provide the source and drain regions 6, 6' doped with boron. The boron ions penetrate the silicon dioxide layer 2 and silicon nitride layer 3, but do not penetrate the photoresist layer 5 which serves as a mask to limit the implantation to the desired regions 6, 6'. The photoresist layer 5 is then stripped. The silicon dioxide layer 2 and silicon nitride layer 3 are then etched away except for those portions directly beneath the silicon dioxide layer 4 which acts as a mask. The latter is itself eventually removed during this etching step, thereby providing the structure shown in FIG. 2.

Figure 3:
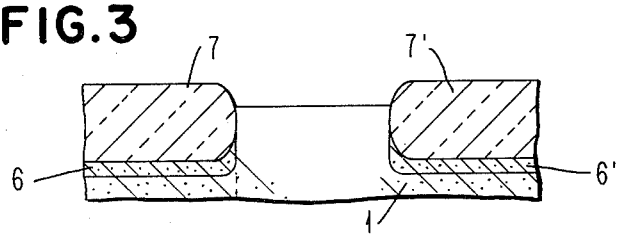

Referring now to FIG. 3, the silicon nitride layer 3 functions as a mask for the next step of growing a thick silicon dioxide layer of about 5000 Å to provide the oxide regions shown at 7, 7'. The silicon nitride layer 3 and silicon dioxide layer 2 of FIG. 2 are then removed to provide the structure shown in FIG. 3. The oxide regions 7, 7' grow downwardly into the upper portions of the boron implanted regions 6, 6'.

Figure 4:
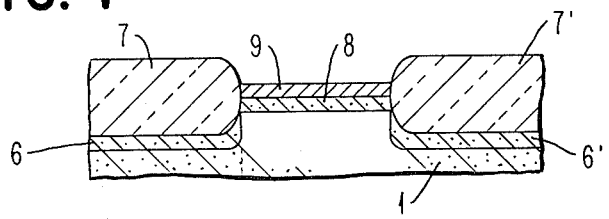

Referring now to FIG. 4, a thin silicon dioxide layer 9 is then grown over the area exposed by the openings between the thick oxide regions 7, 7'. Silicon dioxide layer 9 constitutes the insulating gate oxide for the device being formed. The silicon dioxide layer 9 is preferably about 250 Å in thickness. A threshold-adjust boron ion implantation is then performed to provide the boron doped region 8 immediately beneath the silicon dioxide layer 9. The resulting structure is shown in FIG. 4.

Figure 5:
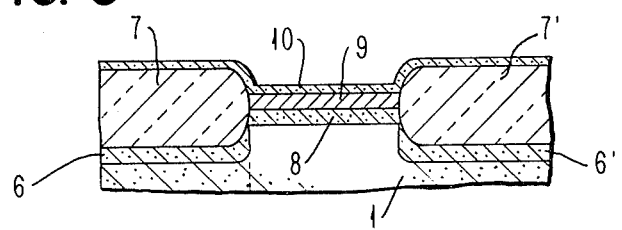
Figure 6:
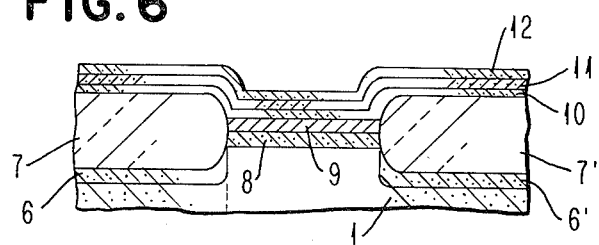

Referring now to FIGS. 5 and 6, the novel steps of the present invention will now be described. A substantially intrinsic layer 10 of polycrystalline silicon of about 1000 Å thick is deposited over the substrate so as to cover the gate oxide layer 9 and thick oxide layer regions 7, 7'. The intrinsic nature of the polycrystalline silicon layer 10 is critical to the present invention, as will be explained below. The resulting structure is that shown in FIG. 5.

As shown in FIG. 6, a second polycrystalline silicon layer 11 of about 1000 Å thickness is then deposited over the initial intrinsic layer 10. The second polycrystalline layer 11 is moderately doped, preferably with a concentration of about $10^{18}$ of impurity atoms of phosphorus per cm.$^3$. A third polycrystalline silicon layer 12 of about 1000 Å thickness is then deposited over the second layer 11. This third layer 12 is preferably relatively more heavily doped as compared with the dopant concentration of layer 11, preferably with a concentration of about $10^{20}$ of impurity atoms of phosphorus per $cm.^3$. The resulting structure is that shown in FIG. 6.

An alternative procedure to the deposition of the three discrete layers 10, 11, 12 would be to deposit a single polycrystalline silicon layer having a graded dopant concentration, starting with substantially intrinsic material adjacent the thin gate oxide layer 9 and gradually increasing in dopant concentration in the direction away from said gate oxide layer 9.

During subsequent hot processing steps, an incidental result of the latter will be the diffusion of the dopant from layers 11 and 12 into the initially intrinsic layer 10, thereby resulting in a polycrystalline silicon gate having the required impurity concentration profile for proper operation. The three polycrystalline silicon layers 10, 11, 12 are shown as a single merged layer 13 in FIG. 7, although it is not to be inferred that the dopant diffusion from layers 10 and 11 into layer 10 is completed at this stage of the process.

The substantially intrinsic nature of the initial polycrystalline layer 10 provides the important advantages of the present invention. That is, the substantial absence of dopant reduces the grain growth and void formation in the polycrystalline silicon. This, in turn, reduces the tendency of hydrofluoric acid to seep through the voids in the polycrystalline silicon layer and to attack the thin gate oxide layer 9 during subsequent processing steps. The insulating function of the gate oxide layer 9 is thereby substantially preserved and the resulting devices have higher voltage breakdown ratings and fewer shorts than would be provided if the initial polycrystalline silicon layer 10 were not substantially intrinsic.

It has been discovered that grain growth and void formation in the polycrystalline silicon gate is still further reduced by providing that the second layer 11 have only a relatively moderate impurity concentration and that the third layer 12 have a relatively heavy impurity concentration.

Figure 7:
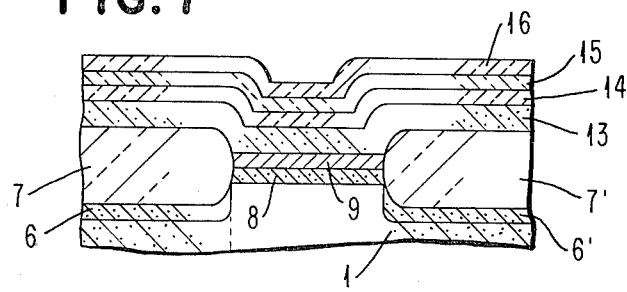

The remaining steps of the process shown in FIGS. 7 through 13 inclusive are conventional and well-known in the prior art and therefore will be only summarily described. Referring to FIG. 7, a silicon dioxide layer 14 is grown and/or deposited over the merged polycrystalline silicon layers formerly shown at 10, 11, 12 and here shown as a single layer 13. A silicon nitride layer 15 is then deposited over the silicon dioxide layer 14, and another silicon dioxide layer 16 is deposited over layer 15. Layer 14 is preferably about 100 Å thick, layer 15 is preferably about 300 Å thick, and layer 16 is preferably about 500 Å thick. The resulting structure is that shown in FIG. 7.

Figure 8:
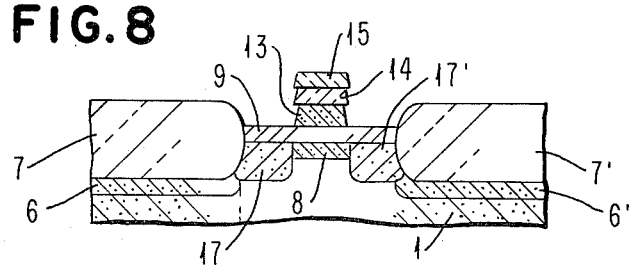

Referring now to FIG. 8, conventional photolithographic and etching steps are performed to define the configurations shown for layers 13, 14 and 15. An arsenic ion implantation is then provided to form the N+ source and drain regions 17, 17'. The resulting structure is that shown in FIG. 8.

Figure 9:
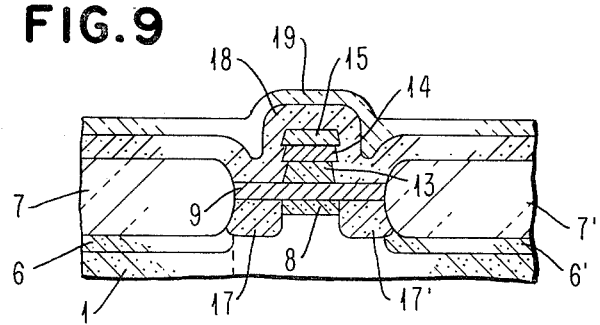

Refer now to FIG. 9, another polycrystalline silicon layer 18 is deposited over the substrate, preferably about 4000 Å in thickness. The layer 18 may be doped without danger of oxide attack by hydrofluoric acid because layer 18 does not extend over a thin oxide region. A silicon dioxide layer 19 is then deposited over layer 18 to provide the structure shown in FIG. 9.

Figure 10:
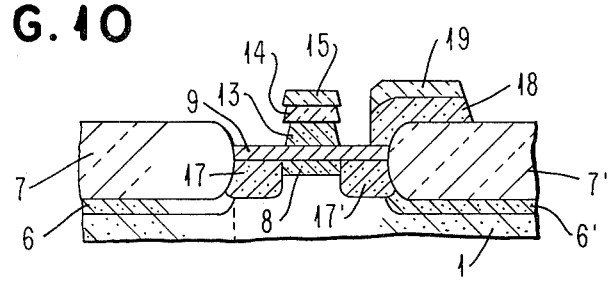
Figure 11:
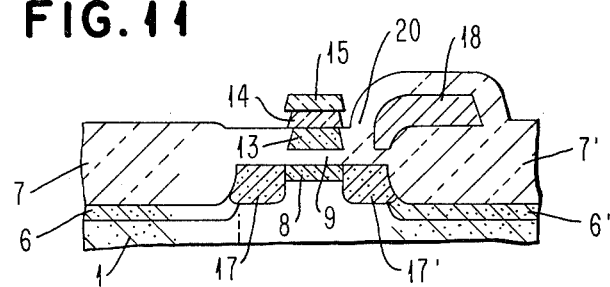

Refer now to FIG. 10, conventional photolithographic and etching steps are performed to remove portions of the polycrystalline silicon layer 18 and silicon dioxide layer 19. As shown in FIG. 11, a thick silicon dioxide layer of about 3000 Å is then grown and merges with the silicon dioxide layer 19 and regions 7, 7', as indicated at 20.

Figure 12:
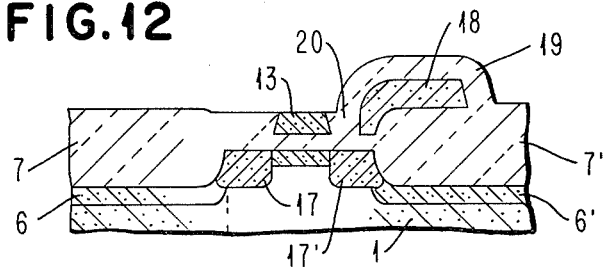

Referring now to FIG. 12, the silicon dioxide layer 14 and silicon nitride layer 15 are then removed by a conventional hydrofluoric acid etch. During this step, if the polycrystalline silicon gate layer 13 had undergone excessive grain growth and void formation, the hydrofluoric acid would tend to seep through the voids and attack the thin gate oxide layer 9, causing the device to have a lower voltage breakdown. However, by providing that the initial polycrystalline silicon layer 10 be substantially intrinsic, the grain growth and void formation tendencies during subsequent processing steps are substantially reduced, thereby reducing the probability of attack of the thin gate oxide layer 9 by the hydrofluoric acid. This probability is still further reduced by the relatively moderate dopant concentration of the second polycrystalline silicon layer 11.

Figure 13:
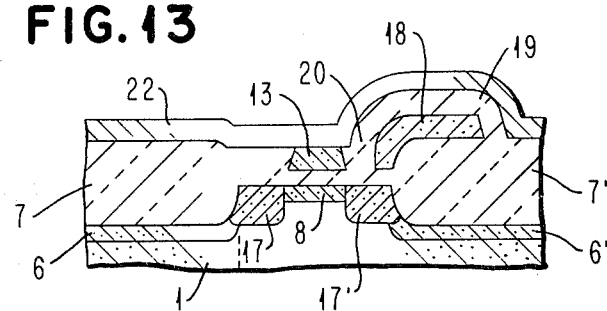

Referring now to FIG. 13, an aluminum metallization layer 22 is deposited over the substrate and in conductive contact with the polycrystalline silicon gate 13 to complete the process.

Having thus described my invention, what I claim as new, and desire to secure by Letters Patent is:

1. A method of making a metal-oxide-semiconductor field-effect device and comprising the steps of:
   providing a planar silicon body,
   forming a thin silicon dioxide insulating layer on a surface of said body,
   depositing a gate comprising a first intrinsic layer of polycrystalline silicon onto said silicon dioxide insulating layer,
   increasing the thickness of said gate by depositing onto said first intrinsic polycrystalline layer at least one additional polycrystalline silicon layer together with the addition of a dopant,
   subjecting said body to subsequent hot processing steps resulting incidentally in diffusion of a portion of the dopant from said additional polycrystalline silicon layer into and throughout said first polycrystalline silicon layer down to said silicon dioxide insulating layer, and
   depositing a metal contact onto said gate and in superimposed vertical alignment with respect to said thin silicon dioxide insulating layer.

2. A method of making a metal-insulator-semiconductor device and comprising the steps of:
   providing a silicon body,
   forming a thin insulating layer on a surface of said body,
   depositing a first intrinsic layer of polycrystalline silicon onto said insulating layer,
   depositing onto said first intrinsic polycrystalline layer at least one additional polycrystalline silicon layer together with the addition of a dopant,
   heating said layers and diffusing a portion of the dopant from said additional polycrystalline silicon layer into and throughout said first polycrystalline silicon layer down to said insulating layer, and
   depositing a metal contact in superimposed vertical alignment with respect to said thin insulating layer and said polycrystalline silicon layers.

3. A method of making a metal-oxide-semiconductor field-effect device and comprising the steps of:
   providing a semiconductor body, forming a thin oxide insulating layer on a surface of said body,
depositing a gate comprising a first intrinsic layer of polycrystalline silicon onto said oxide insulating layer,
increasing the thickness of said gate by depositing onto said first intrinsic polycrystalline layer at least one additional polycrystalline silicon layer together with the addition of a dopant,
heating said gate and diffusing a portion of the dopant from said additional polycrystalline silicon layer into said first polycrystalline silicon layer, and
depositing a metal contact onto said gate and in superimposed vertical alignment with respect to said thin oxide insulating layer.

4. A method of making a metal-insulator-semiconductor device and comprising the steps of:
providing a semiconductor body, forming a thin insulating layer on a surface of said body,
depositing a first intrinsic layer of polycrystalline semiconductive material onto said insulating layer,
depositing onto said first polycrystalline layer at least one additional polycrystalline semiconductive layer together with the addition of a dopant,
heating said layers and diffusing a portion of the dopant from said additional polycrystalline layer into and throughout said first polycrystalline layer down to said insulating layer, and
depositing a metal contact in superimposed vertical alignment with respect to said thin insulating layer and said polycrystalline layers.

5. A method of making a metal-insulator-semiconductor device and comprising the steps of:
providing a silicon body,
forming a thin insulating layer on a surface of said body,
depositing a first intrinsic layer of polycrystalline silicon onto said insulating layer,
depositing onto said first polycrystalline layer at least one additional polycrystalline silicon layer together with the addition of a dopant, diffusing a portion of the dopant from said additional polycrystalline silicon layer into said first polycrystalline silicon layer, and
depositing a metal contact in superimposed vertical alignment with respect to said thin insulating layer and said polycrystalline silicon layers.

6. A method of making a metal-oxide-semiconductor field-effect device and comprising the steps of:
providing a planar silicon body,
forming a thin silicon dioxide insulating layer on a surface of said body,
depositing a gate comprising a first intrinsic layer of polycrystalline silicon onto said silicon dioxide insulating layer,
increasing the thickness of said gate by depositing onto said first intrinsic polycrystalline layer at least one additional polycrystalline silicon layer together with the addition of a dopant, and
diffusing a portion of the dopant from said additional polycrystalline silicon layer into said first polycrystalline silicon layer.

7. A method of making a metal-insulator-semiconductor device and comprising the steps of:
providing a silicon body,
forming a thin insulating layer on a surface of said body,
depositing a first intrinsic layer of polycrystalline semiconductive material onto said insulating layer,
depositing onto said first intrinsic polycrystalline layer at least one additional polycrystalline semiconductive layer together with the addition of a dopant, and
diffusing a portion of the dopant from said additional polycrystalline layer into said first polycrystalline layer.

8. A method of making a metal-oxide-semiconductor field-effect device and comprising the steps of:
providing a semiconductor body,
forming a thin oxide insulating layer on a surface of said body,
depositing a gate comprising a first intrinsic layer of polycrystalline silicon onto said oxide insulating layer,
increasing the thickness of said gate by depositing onto said first intrinsic polycrystalline silicon layer together with the addition of a dopant, and
diffusing a portion of the dopant from said additional polycrystalline silicon layer into said first polycrystalline silicon layer.

9. A method of making a metal-insulator-semiconductor device and comprising the steps of:
providing a semiconductor body,
forming an insulating layer on a surface of said body,
depositing a first intrinsic layer of polycrystalline semiconductive material onto said insulating layer,
depositing onto said first polycrystalline layer at least one additional polycrystalline semiconductive layer together with the addition of a dopant, and
heating said layers and diffusing a portion of the dopant from said additional polycrystalline layer into and throughout said first polycrystalline layer down to said insulating layer.

10. A method of making a metal-insulator semiconductor device and comprising the steps of:
providing a body,
forming an insulating layer on said body,
depositing a first intrinsic layer of silicon onto said insulating layer,
depositing onto said first silicon layer at least one additional silicon layer together with the addition of a dopant,
diffusing a portion of the dopant from said additional silicon layer into said first silicon layer, and
depositing a metal layer in superimposed vertical alignment with respect to said insulating layer and said silicon layers.

11. A method of making a metal-oxide-semiconductor field-effect device and comprising the steps of:
providing a planar silicon body,
forming a thin silicon dioxide insulating layer on a surface of said body,
depositing a gate comprising a first substantially intrinsic layer of polycrystalline silicon onto said silicon dioxide insulating layer,
increasing the thickness of said gate by depositing onto said first intrinsic polycrystalline layer a second polycrystalline silicon layer together with the addition of a dopant at a predetermined concentration,
depositing upon said second layer a third polycrystalline silicon layer together with the addition of a dopant at a concentration greater than said predetermined concentration, subjecting said body to subsequent hot processing steps resulting incidentally in diffusion of a portion of the dopant from said second and third polycrystalline silicon layers into and throughout said first polycrystalline silicon layer down to said silicon dioxide insulating layer, and depositing a metal contact onto said gate and in superimposed vertical alignment with respect to said thin silicon dioxide insulating layer.

12. A method of making a metal-insulator-semiconductor field-effect device and comprising the steps of:

providing a planar semiconductor body, forming a thin insulating layer on a surface of said body, depositing a gate comprising a first substantially intrinsic layer of polycrystalline semiconductive material onto said insulating layer, increasing the thickness of said gate by depositing onto said first intrinsic polycrystalline layer a second polycrystalline semiconductive layer together with the addition of a dopant at a predetermined concentration, depositing upon said second layer a third polycrystalline semiconductive layer together with the addition of a dopant at a concentration greater than said predetermined concentration, diffusing a portion of the dopant from said second and third polycrystalline layers into said first polycrystalline layer, and depositing a metal contact onto said gate and in superimposed vertical alignment with respect to said thin insulating layer.

13. A method of making a metal-oxide-semiconductor field-effect device and comprising the steps of:

providing a planar silicon body, forming a thin silicon dioxide insulating layer on a surface of said body, depositing a gate comprising a first substantially intrinsic layer of polycrystalline silicon onto said silicon dioxide insulating layer, increasing the thickness of said gate by depositing onto said first intrinsic polycrystalline layer a second polycrystalline silicon layer together with the addition of a dopant at a predetermined concentration, depositing upon said second layer a third polycrystalline silicon layer together with the addition of a dopant at a concentration greater than said predetermined concentration, and diffusing a portion of the dopant from said second and third polycrystalline silicon layers into said first polycrystalline silicon layer.

* * * * *